United States Patent
Her et al.

(10) Patent No.: US 8,493,524 B2
(45) Date of Patent: Jul. 23, 2013

(54) ARRAY SUBSTRATE HAVING A GATE DRIVING CIRCUIT WITH AN IMPROVED OUTPUT CHARACTERISTIC AND A DISPLAY APPARATUS HAVING THE SAME

(75) Inventors: Yong-Koo Her, Yongin-si (KR); Jin Jeon, Suwon-si (KR); Yong-Han Park, Suwon-si (KR); Sang-Hoon Lee, Yongin-si (KR); Ji-Suk Lim, Daejeon (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1512 days.

(21) Appl. No.: 11/291,366

(22) Filed: Dec. 1, 2005

(65) Prior Publication Data

US 2006/0146218 A1 Jul. 6, 2006

(30) Foreign Application Priority Data

Jan. 6, 2005 (KR) ........................ 10-2005-0001203

(51) Int. Cl.
*G02F 1/136* (2006.01)
*H01L 31/101* (2006.01)
*H01L 27/088* (2006.01)

(52) U.S. Cl.
USPC ................ 349/43; 349/42; 257/117; 257/396

(58) Field of Classification Search
USPC ................. 455/550; 349/42–43; 257/74, 103, 257/117, 353, 396
See application file for complete search history.

(56) References Cited

U.S. PATENT DOCUMENTS

| 5,493,129 | A | * | 2/1996 | Matsuzaki et al. | ............... 257/61 |
| 2004/0164296 | A1 | * | 8/2004 | Yamazaki et al. | ............... 257/59 |
| 2004/0179144 | A1 | * | 9/2004 | Jeon | ................................ 349/43 |
| 2005/0041168 | A1 | * | 2/2005 | Jang et al. | ........................ 349/43 |
| 2006/0033105 | A1 | * | 2/2006 | Fujii et al. | ........................ 257/66 |

FOREIGN PATENT DOCUMENTS

| CN | 001399161 | | 2/2003 | | |
| JP | 07-202218 | | 8/1995 | | |
| JP | 2003-046090 | | 2/2003 | | |
| JP | 2004-274050 | * | 9/2004 | ........................ 3/36 |
| JP | 2005-527856 | | 9/2005 | | |
| KR | 1020050022559 | | 3/2005 | | |
| TW | 200407641 | | 5/2004 | | |

* cited by examiner

*Primary Examiner* — Lauren Nguyen
(74) *Attorney, Agent, or Firm* — F. Chau & Associates, LLC

(57) ABSTRACT

An array substrate and a display apparatus including the array substrate are provided. The array substrate includes a substrate divided into a display area and a peripheral area adjacent to the display area. A pixel array is formed on the substrate corresponding to the display area and receives a driving signal. A driving circuit includes a plurality of stages and is formed on the substrate corresponding to the peripheral area. Each of the stages includes a first transistor having a source electrode connected to an output terminal to output the driving signal, a channel layer formed between a gate insulating layer and the source electrode, the channel layer having an opening to facilitate contact between a portion of the gate insulating layer and the source electrode, and a capacitor defined by a gate electrode of the first transistor, the source electrode, and the gate insulating layer contacting the source electrode.

12 Claims, 9 Drawing Sheets

ARRAY SUBSTRATE HAVING A GATE DRIVING CIRCUIT WITH AN IMPROVED OUTPUT CHARACTERISTIC AND A DISPLAY APPARATUS HAVING THE SAME

CROSS-REFERENCE TO RELATED APPLICATION

This application claims priority to Korean Patent Application No. 2005-1203, filed on Jan. 6, 2005, the disclosure of which is incorporated by reference herein in its entirety.

BACKGROUND OF THE INVENTION

1. Technical Field

The present invention relates to an array substrate, and more particularly, to an array substrate having a gate driving circuit with an improved output characteristic and a display apparatus having the same.

2. Discussion of the Related Art

A liquid crystal display is one of the most widely used flat panel displays. For example, a liquid crystal display is commonly found in a variety of electronic devices such as flat screen televisions, laptop computers, cell phones and digital cameras.

In general, a liquid crystal display includes a display panel that displays an image in response to a gate signal and a data signal, a gate driving circuit that outputs the gate signal and a data driving circuit that outputs the data signal.

The display panel includes an array substrate on which a plurality of gate lines for receiving the gate signal and a plurality of data lines for receiving the data signal are formed, a color filter substrate facing the array substrate and a liquid crystal layer disposed between the array substrate and the color filter substrate.

The gate driving circuit and the data driving circuit are typically mounted on the liquid crystal display panel. Recently, however, the gate driving circuit has been formed on the array substrate to reduce the size of the liquid crystal display and enhance its productivity.

When the gate driving circuit is formed on the array substrate, the gate driving circuit includes a shift register having a cascade connection. Each of the stages includes a plurality of transistors and a plurality of capacitors.

The capacitors are connected to an output terminal of the shift register to ensure that the gate signal outputted from the shift register has a sufficient rise time. Thus, when a charging capacity of the capacitors is insufficient, the rise time is shortened, thereby deteriorating the output characteristic of the gate driving circuit.

In one technique for enhancing the charging capacity of the capacitors, an electrode area of the capacitors is increased. This, however, causes an increase in the parasitic capacitance that exists between the capacitor electrode and a common electrode of the color filter substrate.

As such, a need exists for an array substrate that includes capacitors having an enhanced charging capacity for reducing the deterioration of the output characteristic of a gate driving circuit.

SUMMARY OF THE INVENTION

An array substrate having a gate driving circuit with an improved output characteristic and a display apparatus having the same are provided.

In one aspect of the present invention, an array substrate includes a substrate, a pixel array and a driving circuit. The substrate is divided into a display area and a peripheral area adjacent to the display area. The pixel array receives a driving signal and is formed on the substrate corresponding to the display area. The driving circuit includes a plurality of stages and is formed on the substrate corresponding to the peripheral area. Each of the stages includes a first transistor having a source electrode connected to an output terminal for outputting the driving signal, a channel layer formed between a gate insulating layer and the source electrode, the channel layer having an opening to facilitate contact between a portion of the gate insulating layer and the source electrode, and a capacitor defined by a gate electrode of the first transistor, the source electrode, and the portion of the gate insulating layer contacting the source electrode.

In another aspect of the present invention, a display apparatus includes an array substrate and an opposite substrate facing the array substrate. The array substrate includes a substrate, a pixel array and a driving circuit. The substrate is divided into a display area and a peripheral area adjacent to the display area. The pixel array receives a driving signal and is formed on the substrate corresponding to the display area. The driving circuit includes a plurality of stages and is formed on the substrate corresponding to the peripheral area. Each of the stages includes a transistor having a source electrode connected to an output terminal for outputting the driving signal, a channel layer formed between a gate insulating layer and the source electrode, the channel layer having an opening to facilitate contact between a portion of the gate insulating layer and the source electrode, and a capacitor defined by a gate electrode of the transistor, the source electrode, and the portion of the gate insulating layer contacting the source electrode.

In still another aspect of the present invention, a display apparatus includes an array substrate, an opposite substrate facing the array substrate, a liquid crystal layer disposed between the array substrate and the opposite substrate, and a driving chip mounted on the array substrate to output a data signal. The array substrate includes a substrate, a pixel array and a gate driving circuit. The substrate is divided into a display area and a peripheral area adjacent to the display area. The pixel array receives a gate signal and a data signal from the driving chip and is formed on the substrate corresponding to the display area. The gate driving circuit includes a plurality of stages. The gate driving circuit is formed on the substrate corresponding to the peripheral area and applies the gate signal to the pixel array. Each of the stages includes a transistor having a source electrode connected to an output terminal for outputting the gate signal, a channel layer formed between a gate insulating layer and the source electrode, the channel layer having an opening to facilitate contact between a portion of the gate insulating layer and the source electrode, and a capacitor defined by a gate electrode of the transistor, the source electrode, and the portion of the gate insulating layer contacting the source electrode.

BRIEF DESCRIPTION OF THE DRAWINGS

The above and other aspects of the present invention will become more apparent by describing in detail exemplary embodiments thereof with reference to the attached drawings in which.

DESCRIPTION OF EXEMPLARY EMBODIMENTS

Figure 1:
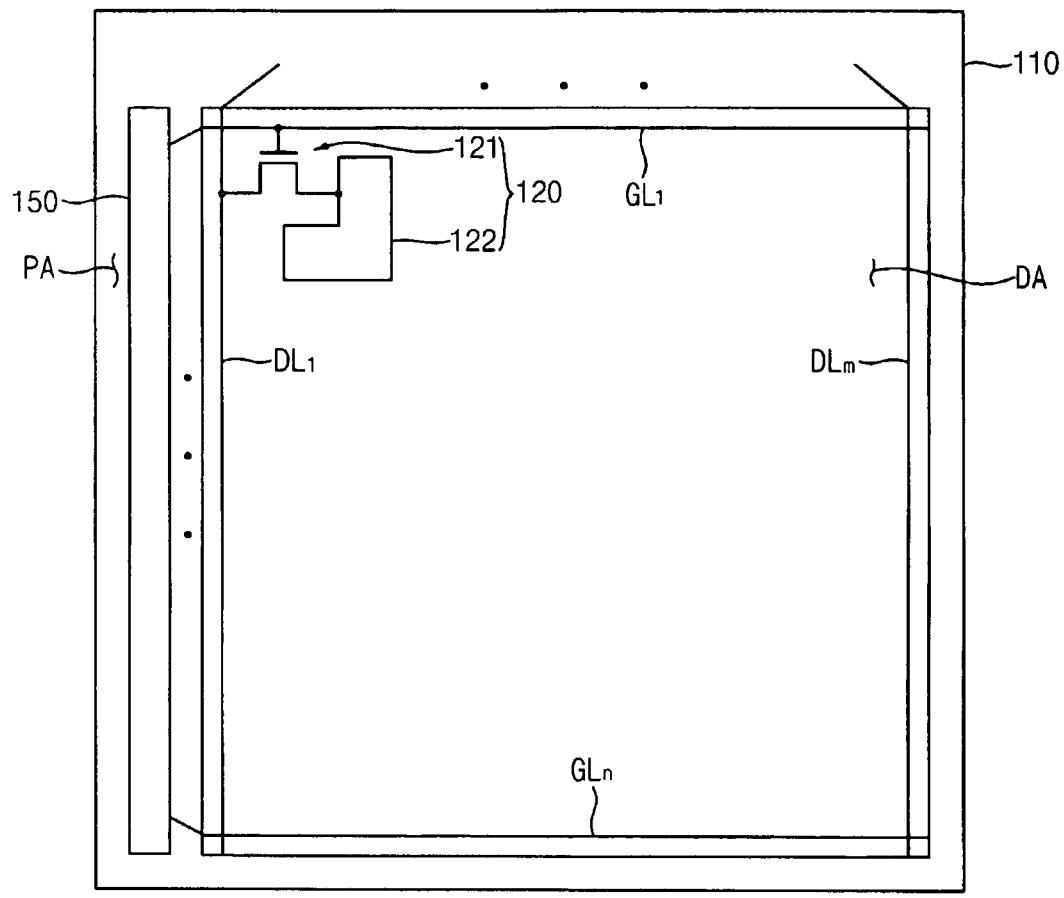
FIG. 1 is a plan view showing an array substrate according to an exemplary embodiment of the present invention.
Figure 2:
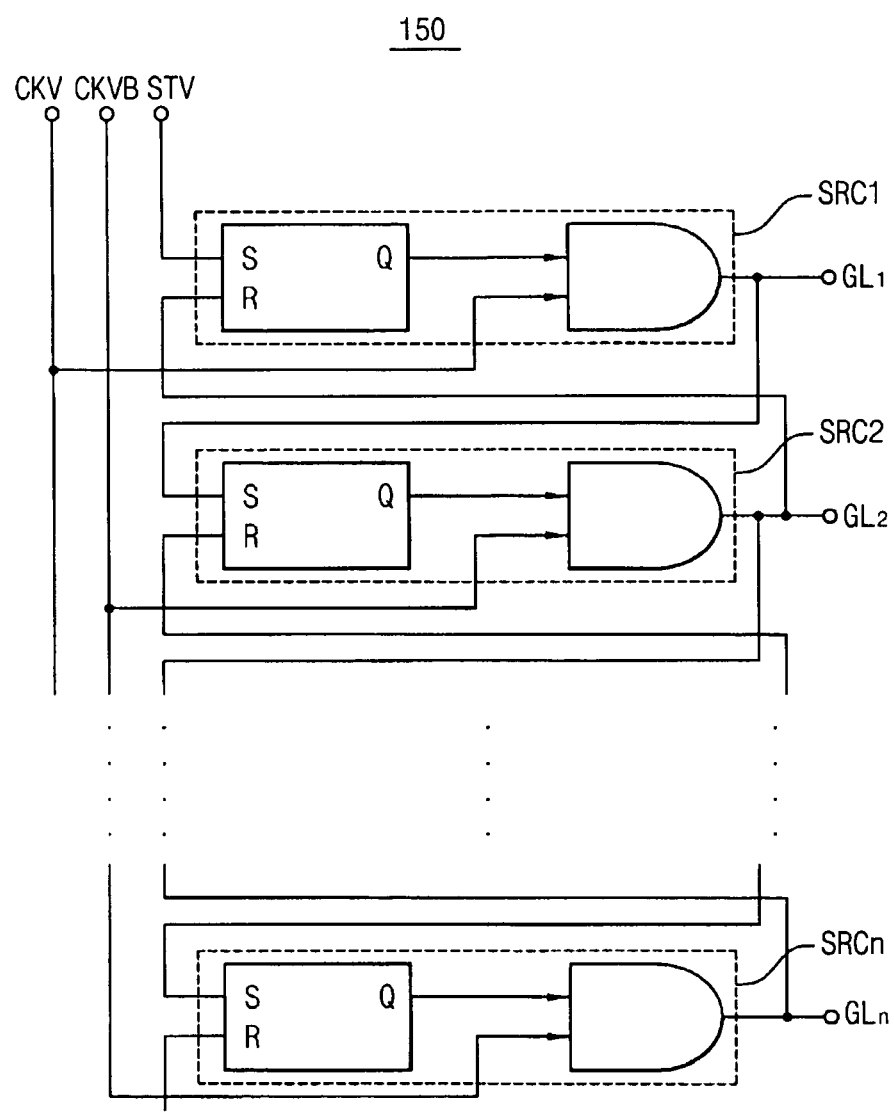
FIG. 2 is a block diagram showing a gate driving circuit in FIG. 1.

FIG. 1 is a plan view showing an array substrate 100 according to an exemplary embodiment of the present invention. FIG. 2 is a block diagram showing a gate driving circuit 150 in FIG. 1.

Referring to FIG. 1, the array substrate 100 includes a substrate 110, a pixel array 120 and the gate driving circuit 150.

The substrate 110 includes a display area DA and a peripheral area PA adjacent to the display area DA. The pixel array 120 is formed on the substrate 110 corresponding to the display area DA, and the gate driving circuit 150 is formed on the substrate 110 corresponding to the peripheral area PA. The pixel array 120 and the gate driving circuit 150 are formed on the substrate 110 by a thin film process.

The pixel array 120 includes a plurality of gate lines GL1 to GLn, a plurality of data lines DL1 to DLm, a plurality of thin film transistors (TFTs) 121 and a plurality of pixel electrodes 122. The gate lines GL1 to GLn intersect with and are insulated from the data lines DL1 to DLm. The TFTs 121 and the pixel electrodes 122 are formed on the substrate 110 in a matrix configuration. The TFTs 121 are electrically connected to a corresponding gate line and a corresponding data line. For example, a first TFT of the TFTs 121 includes a gate electrode electrically connected to a first gate line GL1, a source electrode electrically connected to a first data line DL1 and a drain electrode electrically connected to a first pixel electrode of the pixel electrodes 122.

The gate driving circuit 150 is formed in the peripheral area PA and is adjacent to an end of the gate lines GL1 to GLn. The gate driving circuit 150 is electrically connected to the end of the gate lines GL1 to GLn and sequentially outputs a gate signal to the gate lines GL1 to GLn.

As shown in FIG. 2, the gate driving circuit 150 includes a shift register. The shift register includes a plurality of stages SRC1, SRC2 ... SRCn-1, SRCn connected one after another to each other and the shift register sequentially outputs the gate signal. Each of the stages SRC1, SRC2 ... SRCn-1, SRCn includes an S-R latch and an AND-gate.

When the shift register is operated, the S-R latch of one of the stages SRC1, SRC2 ... SRCn-1, S RCn is activated in response to a previous gate signal from a previous stage and is inactivated in response to a next gate signal from a next stage. The AND-gate then generates the gate signal when the S-R latch is activated and a clock is applied at a high level.

For example, odd-numbered stages SRC1 to SRCn-1 receive a first clock CKV and even-numbered stages SRC2 to SRCn receive a second clock CKVB having a different phase than the first clock CKV. In an exemplary embodiment, the first and second clocks CKV and CKVB have a phase opposite to each other.

Thus, the AND-gate of the odd-numbered stages SRC1 to SRCn-1 generates the gate signal when the S-R latch is activated and the first clock CKV is applied at the high level. The AND-gate of the even-numbered stages SRC2 to SRCn generates the gate signal when the S-R latch is activated and the second clock CKVB is applied at the high level.

Figure 3:
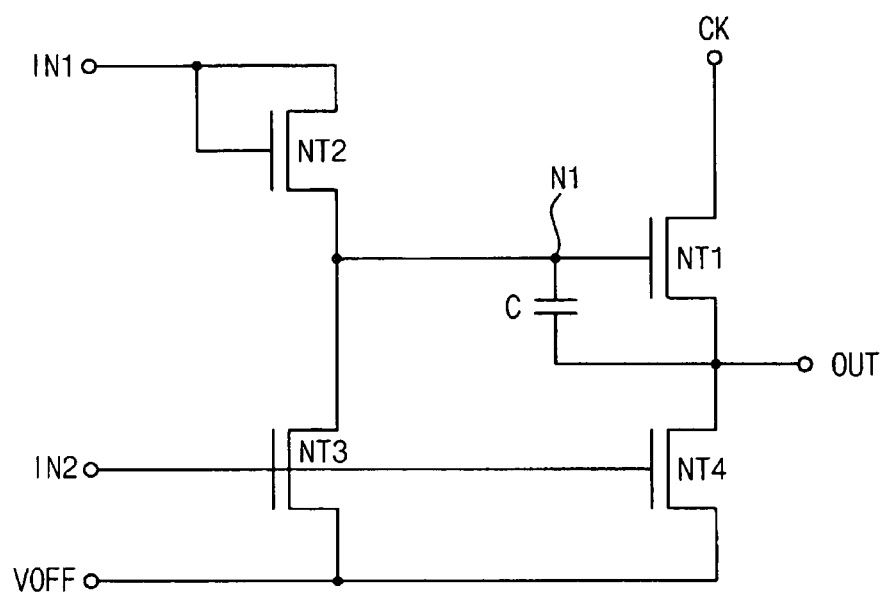
FIG. 3 is a circuit diagram of a stage in FIG. 2.
Figure 4:
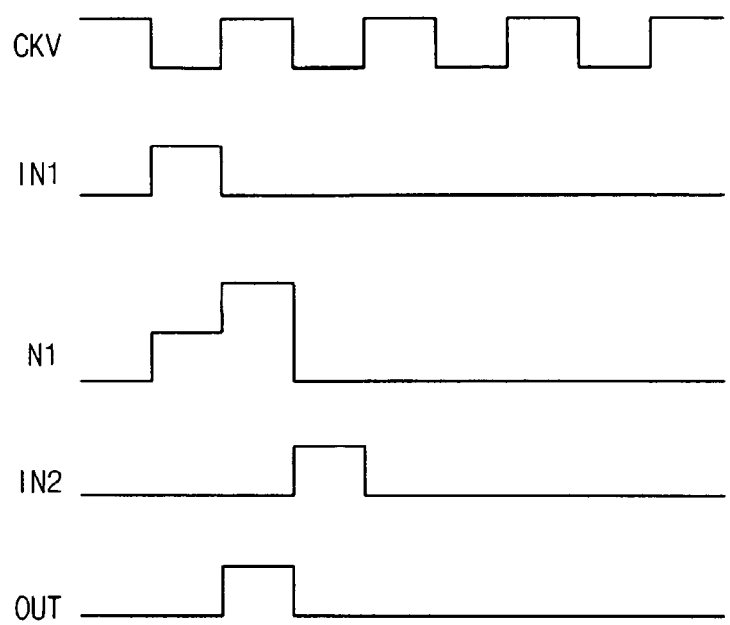
FIG. 4 is a waveform diagram of an electric potential of a first node and an output signal in FIG. 3.

FIG. 3 is a circuit diagram of one of the stages SRC1, SRC2 ... SRCn-1, SRCn in FIG. 2. FIG. 4 is a waveform diagram of an electric potential of a first node N1 and an output signal output from the output terminal OUT in FIG. 3.

Referring to FIG. 3, the stage includes a capacitor C, and first, second, third and fourth TFTs NT1, NT2, NT3 and NT4.

The first TFT NT1 includes a drain electrode connected to a clock terminal CK, a gate electrode connected to a first electrode of the capacitor C via the first node N1, and a source electrode connected to a second electrode of the capacitor C and an output terminal OUT. The clock terminal CK receives either the first clock CKV or the second clock CKVB having a phase opposite to the first clock CKV.

The second TFT NT2 includes a drain electrode and a gate electrode receiving a first input signal IN1, and a source electrode connected to a drain electrode of the third TFT NT3. In an exemplary embodiment, the first input signal IN1 is either a scan start signal STV or the previous gate signal of the previous stage.

The third TFT NT3 includes a gate electrode for receiving a second input signal IN2, a drain electrode connected to the source electrode of the second TFT NT2, and a source electrode for receiving an off voltage Voff. In an exemplary embodiment, the second input signal IN2 is the next gate signal of the next stage.

The fourth TFT NT4 includes a drain electrode connected to the source electrode of the first TFT NT1 and the second electrode of the capacitor C, a gate electrode for receiving the second input signal IN2, and a source electrode for receiving the off voltage Voff.

As shown in FIG. 4, when the first input signal IN1 is applied at a high level, the first node N1 has an electric potential at the high level. When the capacitor C is charged in response to the first input signal IN1, the electric potential of the first node N1 is bootstrapped, thereby raising the electric potential of the first node N1. According to the increase of the electric potential of the first node N1, the first TFT NT1 is turned on. The first clock CKV or the second clock CKVB applied through the clock terminal CK of FIG. 3 is then outputted as the gate signal to the output terminal OUT through the first TFT NT1.

Figure 5:
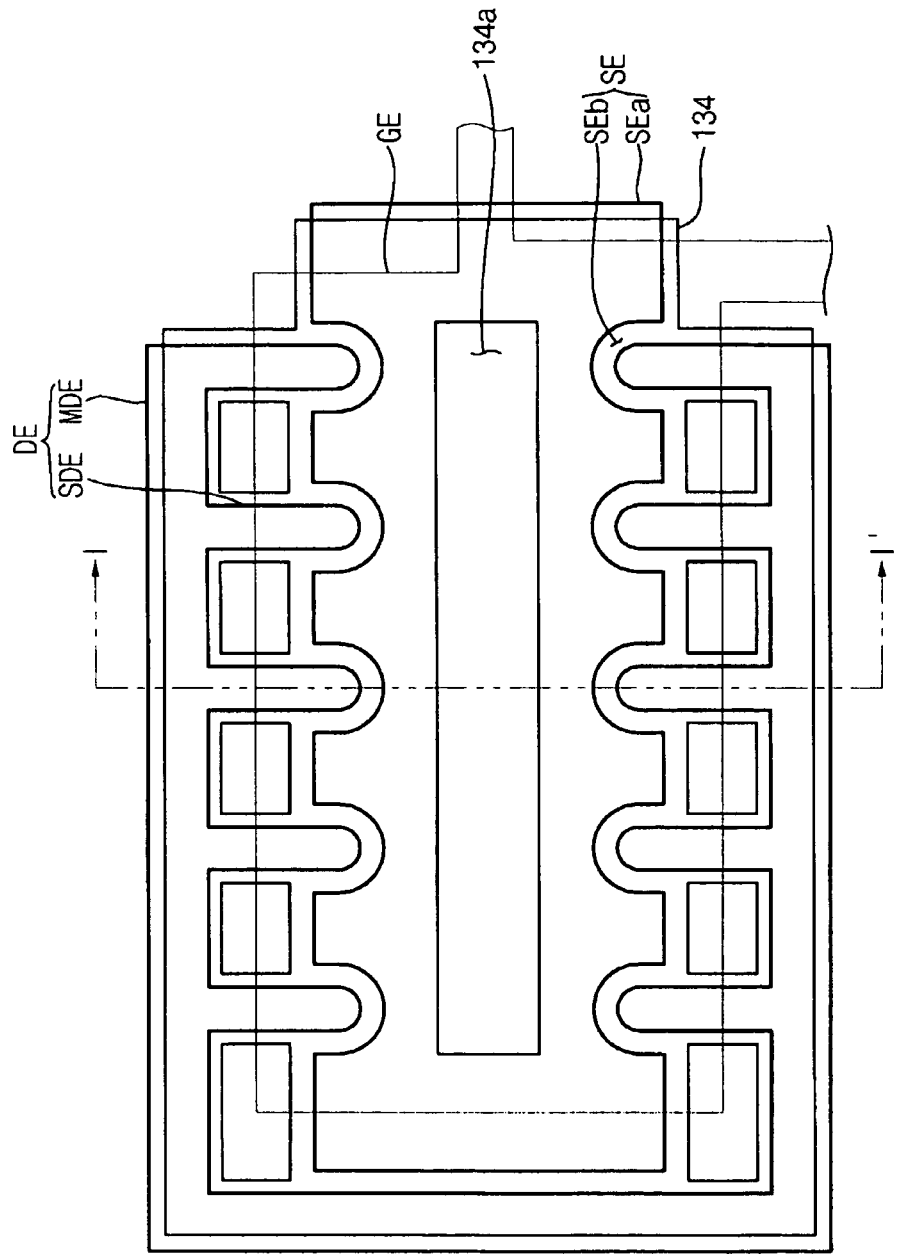
FIG. 5 is a plan view showing a layout of a first TFT and a capacitor in FIG. 3.
Figure 6:
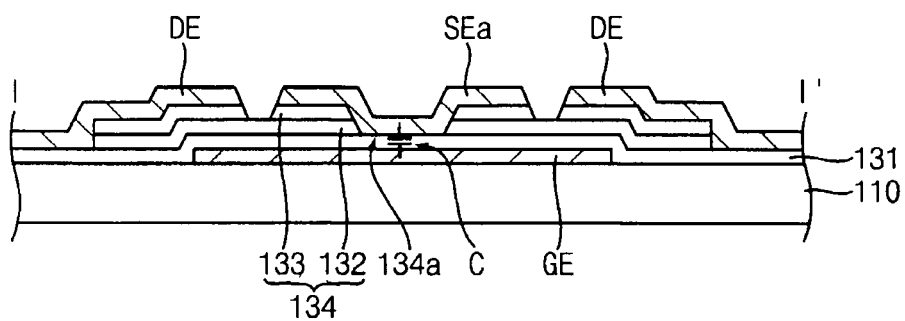
FIG. 6 is a cross-sectional view taken along a line I-I' showing the array substrate in FIG. 5.

FIG. 5 is a plan view showing a layout of the first TFT NT1 and the capacitor C in FIG. 3. FIG. 6 is a cross-sectional view taken along a line I-I' showing the array substrate in FIG. 5.

Referring to FIGS. 5 and 6, the gate electrode (e.g., GE) of the first TFT NT1 is formed on the substrate 110. The gate electrode GE has a generally rectangular shape. A gate insulating layer 131 is formed over the substrate 110 to cover the gate electrode GE.

A channel layer 134 is formed on the gate insulating layer 131 corresponding to the gate electrode GE. The channel layer 134 includes an active layer 132 and an ohmic contact layer 133 formed on the active layer 132. The active layer 132 includes a polycrystalline silicon, and the ohmic contact layer 133 includes an $N^+$-doped polycrystalline silicon.

The source electrode (e.g., SE) and the drain electrode (e.g., DE) of the first TFT NT1 are formed on the ohmic contact layer 133 and the gate insulating layer 131. The drain electrode DE includes a main drain electrode MDE and a plurality of sub drain electrodes SDE. The main drain electrode MDE is formed in an area outside an area where the gate electrode GE is formed. The sub drain electrodes SDE are branched from the main drain electrodes MDE and extended to the area where the gate electrode GE is formed, and the sub drain electrodes SDE are spaced apart from each other by a predetermined distance.

The source electrode SE includes an electrode body SEa and a plurality of electrode recesses SEb. The electrode recesses SEb generally have a U shape and receive the sub drain electrodes SDE. Thus, the source electrode SE and the sub drain electrode SDE face each other on the gate electrode GE.

As shown in FIG. 6, the channel layer 134 between the source electrode SE and the gate insulating layer 131 has an opening 134a through which the gate insulating layer 131 on the gate electrode GE partially makes contact with the source electrode SE. In other words, the opening 134a facilitates contact between a portion of the gate insulating layer 131 on the gate electrode GE with the source electrode SE. The capacitor C, shown for example in FIG. 3, is formed between the source electrode SE and the gate electrode GE.

In general, a charging capacity of a capacitor is substantially inversed in proportion to a space between two electrodes of the capacitor. Thus, when the channel layer 134 is partially removed to reduce the space between the source electrode SE and the gate electrode GE as shown in FIG. 6, the charging capacity of the capacitor C may be enhanced.

Therefore, the rise time of the gate signal outputted from the gate driving circuit 150 may be sufficiently ensured. Thus, the gate driving circuit 150 may have an improved output characteristic.

In addition, even though an area of the source and gate electrodes SE and GE is not increased, the charging capacity of the capacitor C may also be enhanced. Thus, the parasitic capacitance between the source and gate electrodes SE and GE and a common electrode (not shown) formed on an opposite substrate (not shown) may be prevented. The opposite substrate may be known as a common electrode substrate or a color filter substrate.

Figure 7:
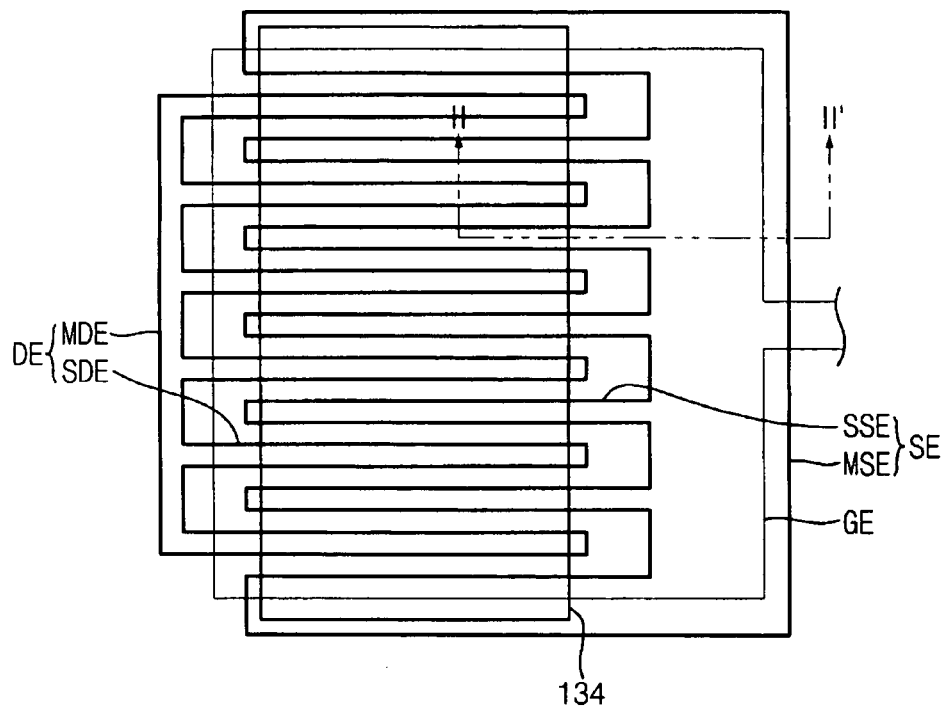
FIG. 7 is a plan view showing a layout of a first TFT and a capacitor according to another exemplary embodiment of the present invention.
Figure 8:
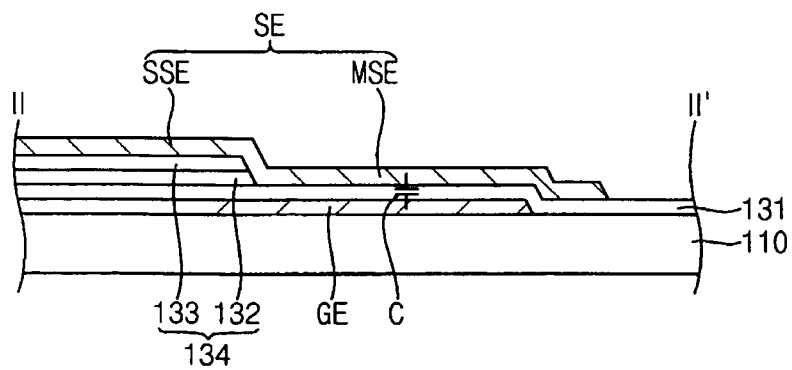
FIG. 8 is a cross-sectional view taken along a line II-II' of FIG. 7.

FIG. 7 is a plan view showing a layout of a first TFT NT1 and a capacitor C according to another exemplary embodiment of the present invention. FIG. 8 is a cross-sectional view taken along a line II-II' of FIG. 7.

Referring to FIGS. 7 and 8, a gate electrode GE of the first TFT NT1 is formed on the substrate 110. The gate electrode GE has a generally rectangular shape. A gate insulating layer 131 is formed over the substrate 110 to cover the gate electrode GE.

A channel layer 134 is formed on the gate insulating layer 131 corresponding to the gate electrode GE. The channel layer 134 includes an active layer 132 and an ohmic contact layer 133 formed on the active layer 132.

A source electrode SE and a drain electrode DE of the first TFT NT1 are formed on the ohmic contact layer 133 and the gate insulating layer 131. The drain electrode DE includes a main drain electrode MDE and a plurality of sub drain electrodes SDE. The main drain electrode MDE is formed in an area outside an area where the gate electrode GE is formed. The sub drain electrodes SDE are branched from the main drain electrodes MDE and extended to the area where the gate electrode GE is formed, and the sub drain electrodes SDE are spaced apart from each other by a predetermined distance.

The source electrode SE includes a main source electrode MSE and a plurality of sub source electrodes SSE. The main source electrode MSE is formed on the gate insulating layer 131 corresponding to the gate electrode GE and the main source electrode MSE faces the gate electrode GE. As shown in FIG. 8, the channel layer 134 between the sub source electrode SSE and the gate insulating layer 131 has an opening 134a through which the gate insulating layer 131 on the gate electrode GE partially makes contact with the main source electrode MSE. In other words, the opening 134a facilitates contact between a portion of the gate insulating layer 131 on the gate electrode GE and the main source electrode MSE.

As shown in FIGS. 7 and 8, when the channel layer 134 is partially removed to reduce the space between the main source electrode MSE and the gate electrode GE, the charging capacity of the capacitor C may be enhanced. Thus, the gate driving circuit 150 may have an improved output characteristic.

Figure 9:
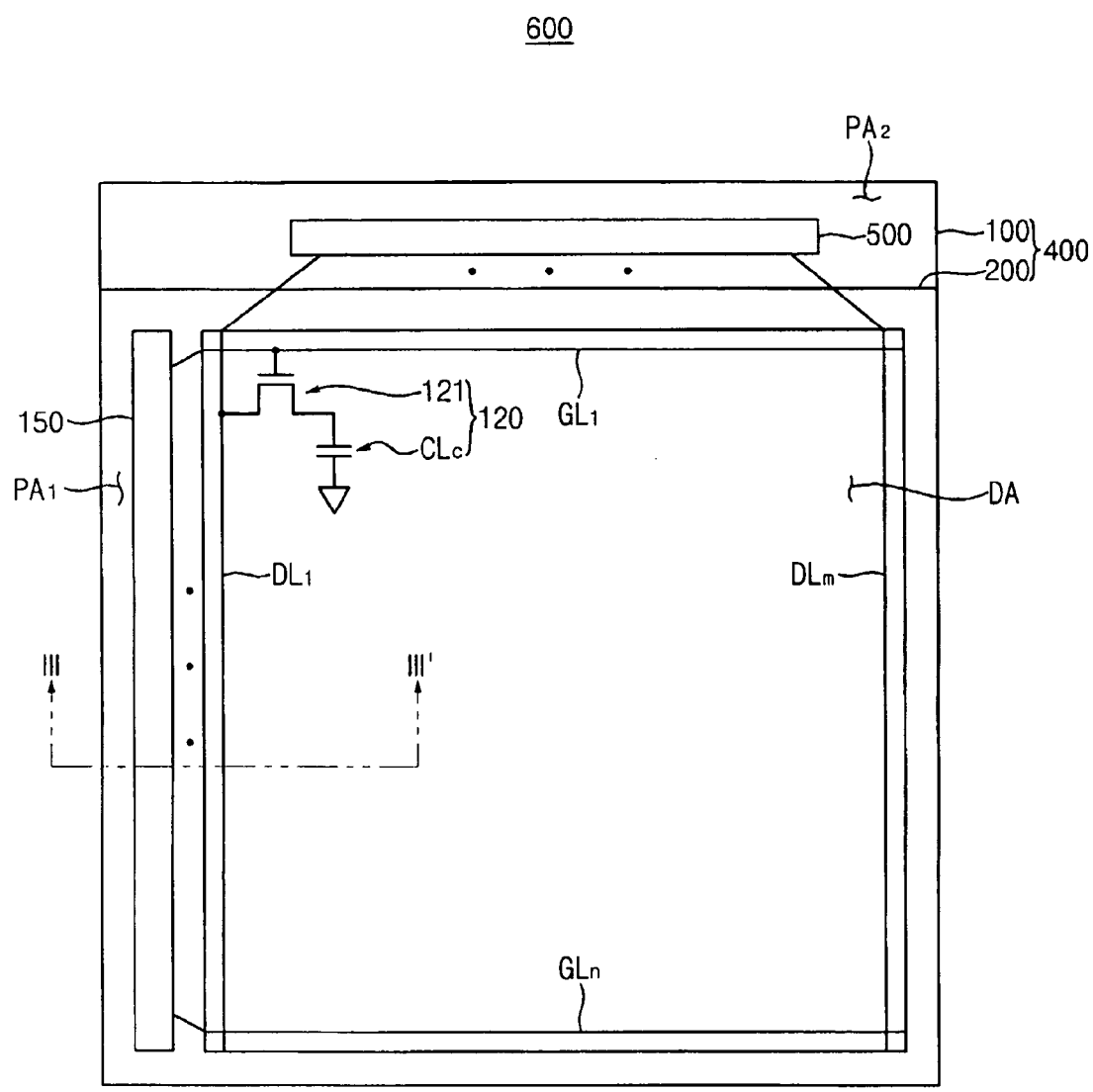
FIG. 9 is a plan view showing a display apparatus according to another exemplary embodiment of the present invention.
Figure 10:
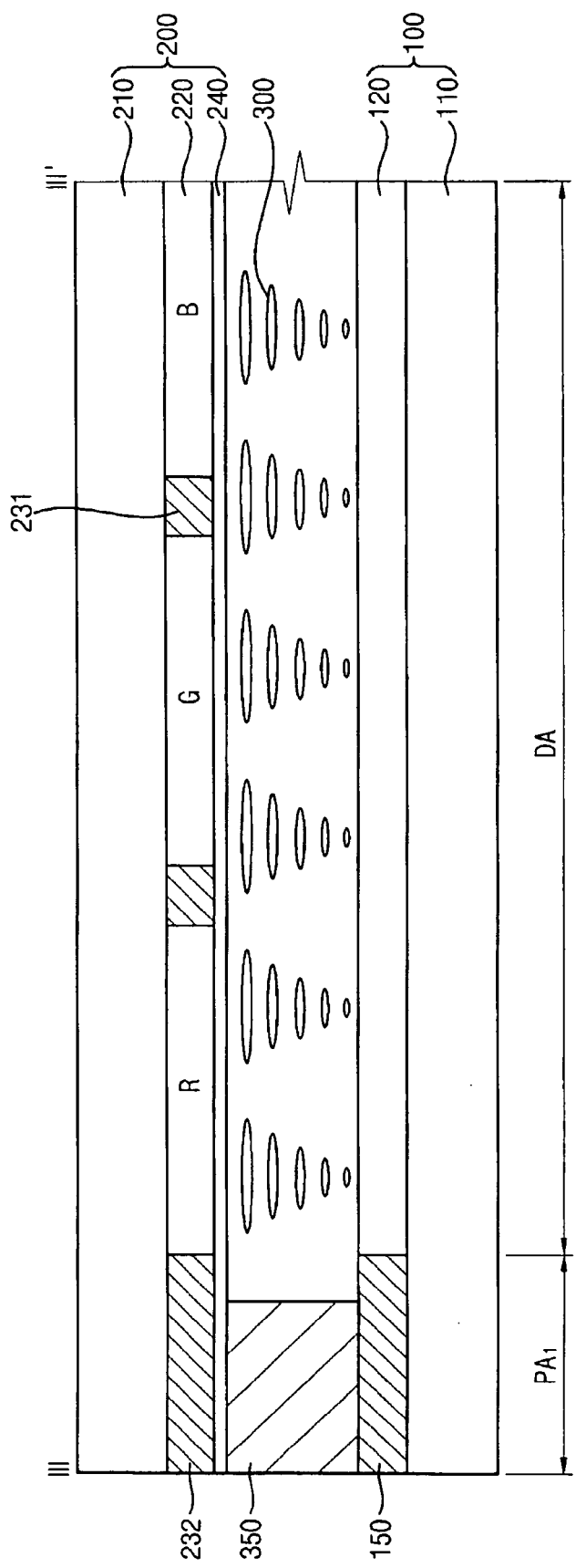
FIG. 10 is a cross-sectional view taken along a line III-III' showing the display apparatus in FIG. 9.

FIG. 9 is a plan view showing a display apparatus according to another exemplary embodiment of the present invention. FIG. 10 is a cross-sectional view taken along a line III-III' showing the display apparatus in FIG. 9.

Referring to FIGS. 9 and 10, a display apparatus 600 includes a display panel 400 that displays an image. The display panel 400 includes the array substrate 100 of, for example, FIG. 1, an opposite substrate 200, a liquid crystal layer 300 and a sealant 350. The opposite substrate may be known as a common electrode substrate or a color filter substrate.

The opposite substrate 200 includes a substrate 210, a color filter layer 220, a first black matrix 231, a second black matrix 232 and a common electrode 240. The opposite substrate 200 faces the array substrate 100.

The color filter layer 220 includes red, green and blue color pixels R, G and B and is formed on the substrate 210 corresponding to a display area DA. The first black matrix 231 is formed between two adjacent color pixels, and the second black matrix 232 is formed in an area corresponding to a first peripheral area PA1 surrounding the display area DA. The second black matrix 232 prevents the gate driving circuit 150 from being projected onto a screen of the display panel 400.

The liquid crystal layer 300 is disposed between the array substrate 100 and the opposite substrate 200 and is formed in the display area DA. The sealant 350 is disposed between the array substrate 100 and the opposite substrate 200 and is formed in the first peripheral area PA1. Thus, the sealant 350 may seal the liquid crystal layer 300.

The sealant 350 is also formed in an area corresponding to the area where the opposite substrate 200 partially covers the gate driving circuit 150. The sealant 350 includes a material having a lower dielectric constant than the liquid crystal layer 300. Thus, the parasitic capacitance between the common electrode 240 and the gate driving circuit 150 may be reduced. As a result, the display apparatus 600 may prevent the distortion of an input/output signal of the gate driving circuit 150, thereby preventing the malfunction thereof.

As shown in FIG. 9, the display apparatus 600 may further include a driving chip 500 mounted on the array substrate 100. The driving chip 500 is formed, for example, in a second peripheral area PA2 adjacent to the first peripheral area PA1. The driving chip 500 is electrically connected to the data lines DL1 to DLm formed on the array substrate 100 and applies the data signal to the data lines DL1 to DLm. Alternatively, the driving chip 500 may be formed on a film.

According to an exemplary embodiment of the present invention, the channel layer between the gate insulating layer and the source electrode of the transistor connected to the output terminal of the gate driving circuit has an opening through which the gate insulating layer on the gate electrode partially makes contact with the source electrode.

Thus, the capacitor between the gate electrode and the source electrode may have an enhanced charging capacity. As a result, the rise time of the gate signal may be sufficiently ensured, to thereby prevent the deterioration of the output characteristic of the gate driving circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An array substrate comprising:
   a substrate having a display area and a peripheral area adjacent to the display area;
   a pixel array that receives a driving signal, the pixel array formed on the substrate corresponding to the display area; and
   a driving circuit comprising a plurality of stages, and formed on the substrate corresponding to the peripheral area, wherein at least one of the stages comprises:
   a first transistor comprising a gate electrode, a source electrode, a drain electrode, a gate insulating layer that electrically insulates the gate electrode from the source and drain electrode, and an active layer disposed on the gate insulating layer,
   wherein the active layer includes a first area for overlapping with the source electrode and a second area for overlapping with the drain electrode,
   wherein the first area has an opening that exposes a portion of the gate insulating layer to the source electrode to enhance a capacitance between the source electrode and the gate electrode,
   wherein the opening is overlapped with the gate electrode,
   wherein the drain electrode comprises a main drain electrode and a plurality of sub drain electrodes branched from the main drain electrode and spaced apart from each other, the main drain electrode is spaced apart from the gate electrode in a plan view, and the source electrode comprises an electrode body covering the opening, and a plurality of recesses that enclose ends of the sub drain electrodes, and wherein at least a portion of the electrode body is disposed on the gate electrode, and
   wherein the opening continuously extends from one of the sub drain electrodes to another of the sub drain electrodes along a lengthwise direction of the gate electrode.

2. The array substrate of claim 1, wherein the electrode body is fully overlapped by the gate electrode, and the opening of the active layer corresponds to the overlapped area between the electrode body and the gate electrode.

3. The array substrate of claim 1, wherein the at least one of the stages comprises:
   a second transistor that operates in response to a previous output signal from one of previous stages;
   a third transistor that discharges the capacitor in response to a next output signal from one of next stages; and
   a fourth transistor that discharges a present output signal in response to the next output signal.

4. The array substrate of claim 3, wherein the second transistor comprises:
   a gate electrode to which the previous output signal is applied, a drain electrode to which the previous output signal is applied and a source electrode electrically connected to the gate electrode of the first transistor, the third transistor comprises a drain electrode electrically connected to the source electrode of the second transistor, a gate electrode to which the next output signal is applied, and a source electrode to which an off voltage is applied, and the fourth transistor comprises a gate electrode to which the next output signal is applied, a source electrode to which the off voltage is applied and a drain electrode electrically connected to the source electrode of the first transistor.

5. The array substrate of claim 3, wherein the capacitor charges a signal from the second transistor, the first transistor outputs a clock signal to the output terminal as the present output signal in response to the charged signal of the capacitor, and the first transistor comprises a drain electrode to which the clock signal is applied, wherein the gate electrode is electrically connected to a source electrode of the second transistor and the source electrode is connected to the output terminal.

6. The array substrate of claim 1, wherein the pixel array comprises:
   a plurality of pixels formed on the substrate in a matrix configuration, wherein each of the pixels comprises:
   a gate line that receives a gate signal;
   a data line that receives a data signal, the data line intersecting with the gate line and insulated from the gate line;
   a pixel transistor that outputs the data signal in response to the gate signal, the pixel transistor electrically connected to the gate line; and
   a pixel electrode that receives the data signal from the pixel transistor.

7. The array substrate of claim 6, wherein the driving circuit is a gate driving circuit that sequentially outputs the gate signal to the gate lines of the pixels.

8. The array substrate of claim 1, wherein the plurality of stages are connected one after another to each other.

9. The array substrate of claim 1, wherein the opening is formed between the source electrode and the gate electrode.

10. The array substrate of claim 1, wherein the first transistor further comprises an ohmic contact layer formed on the active layer.

11. The array substrate of claim 10, wherein the active layer comprises a polycrystalline silicon and
    the ohmic contact layer comprises $N^+$-doped polycrystalline silicon.

12. The array substrate of claim 11, wherein the active layer and the ohmic contact layer are formed between the gate electrode and the source electrode, and at least one layer of the active layer and the ohmic contact layer is partially removed.

* * * * *